US006441615B1

(12) United States Patent
Fujita et al.

(10) Patent No.: US 6,441,615 B1
(45) Date of Patent: Aug. 27, 2002

(54) CROSSED-LADDER RF COILS FOR VERTICAL FIELD MRI SYSTEMS

(75) Inventors: Hiroyuki Fujita, Highland Heights; Gordon D. DeMeester, Wickliffe; Michael A. Morich, Mentor, all of OH (US)

(73) Assignee: Koninklijke Philips Electronics, NV, Eindhoven (NL)

( * ) Notice: Subject to any disclaimer, the term of this patent is extended or adjusted under 35 U.S.C. 154(b) by 0 days.

(21) Appl. No.: 09/473,072

(22) Filed: Dec. 28, 1999

(51) Int. Cl.$^7$ .................................. G01V 3/00
(52) U.S. Cl. .................. 324/318; 324/322; 324/320
(58) Field of Search .................. 324/318, 320, 324/322

(56) References Cited

U.S. PATENT DOCUMENTS

| | | | | |
|---|---|---|---|---|
| 4,816,765 A | | 3/1989 | Boskamp | 324/318 |
| 4,918,388 A | | 4/1990 | Mehdizadeh et al. | 324/322 |
| 5,030,915 A | | 7/1991 | Boskamp et al. | 324/318 |
| 5,235,277 A | | 8/1993 | Wichern | 324/318 |
| 5,578,925 A | | 11/1996 | Molyneaux et al. | 324/318 |
| 5,696,449 A | | 12/1997 | Boskamp | 324/318 |
| 5,757,189 A | * | 5/1998 | Molyneaux et al. | 324/318 |
| 5,898,306 A | | 4/1999 | Liu et al. | 324/322 |
| 6,043,658 A | * | 3/2000 | Leussler | 324/318 |
| 6,169,401 B1 | * | 1/2001 | Fujita et al. | 324/318 |

OTHER PUBLICATIONS

"Vertical Field Open RF Body Coils", Boskamp, et al., Proceedings of the ISMRM p. 736, 1999.
"A Degenerate Bandpass Ladder Network for Spine Imaging in Lateral Magnetic Fields", Boskamp, et al., Proceedings of the ISMRM p. 2024, 1998.
"Circular Polarized RF Coils for Open Magnet Systems", Viohl, Proceedings of the Society of Magnetic Resonance, p. 183, Nice France Aug. 19–25, 1995.

Lee, et al., "A Quadrature Excitation RF Coil For Open MRI System", Proc. ISMRM, 4th Meeting & Exhibition, NY US Apr. 27–May 3, 1996, v. 3, p. 1419 XP–002189300.

Liu, et al., "A New Quadrature Surface RF Coil", Proc. ISMRM, 5th Meeting & Exhibition, Vancouver, BC Canada, Apr. 12–18, 1997, v. 3, p. 1493, XP–002189301.

* cited by examiner

*Primary Examiner*—Edward Lefkowitz
*Assistant Examiner*—Dixomara Vargas
(74) *Attorney, Agent, or Firm*—Fay, Sharpe, Fagan, Minnich & McKee, LLP

(57) ABSTRACT

A crossed-ladder RF coil assembly (48) is employed for quadrature excitation and/or reception in an open or vertical field magnetic resonance apparatus. The RF coil assembly (48, 70, 90) includes a pair of coil assemblies (50, 52; 70, 72; 100, 102) which are disposed in a parallel relationship. Coil arrays (50, 52; 100, 102) include at least two ladder RF coils ($50_1$, $50_2$, $50_3$; $52_1$, $52_2$, $52_3$; $100_1$ . . . , $100_8$; $102_1$, . . . , $102_8$) which are disposed in an overlapping relationship and are rotated by 90° relative to one another. Each ladder RF coil of one coil array is rotated by 90° relative to adjoining ladder coils and each corresponding ladder RF coil of the other coil array. The crossed-ladder RF coil assembly provides better $B_1$ field uniformity and elongated anatomical coverage for spine and neck imaging. In addition, the RF coil assembly reduces noise from the body at higher fields in vertical field magnetic resonance systems.

17 Claims, 4 Drawing Sheets

CROSSED-LADDER RF COILS FOR VERTICAL FIELD MRI SYSTEMS

BACKGROUND OF THE INVENTION

The present invention relates to the magnetic resonance arts. It finds particular application in conjunction with magnetic resonance imaging in open magnetic resonance imaging systems and will be described with particular reference thereto. However, it is to be appreciated that the present invention will also find application in conjunction with other magnetic resonance imaging and spectroscopy systems, particularly those in which the $B_0$ main magnetic field is orthogonal to the plane of the radio frequency coils.

Conventionally, magnetic resonance imaging procedures include disposing the patient in a substantially uniform, temporally constant main magnetic field $B_0$. The resulting magnetization of the sample is manipulated with radio frequency magnetic fields that are applied to the examination region so as to manipulate the magnetization and produce magnetic resonance signals. These signals are received and used to produce images or spectra from the sample.

Often, the $B_0$ field is generated along the central bore of an annular magnet assembly, i.e., the $B_0$ field aligns with the central axis of the patient. In bore-type systems, ladder RF coils have recently been utilized for quadrature detection. The ladder coils have a mode that is perpendicular and a mode that is parallel to the surface of the coil. In a bore type magnet, both modes are readily oriented perpendicular to the $B_0$ field. In this orientation, the coil receives resonance signals in quadrature.

However, not all magnetic resonance systems employ a horizontal $B_0$ magnetic field. Vertical field or open magnetic resonance imaging systems typically include a pair of parallel disposed pole pieces which are often interconnected by a ferrous flux return path. Electrical coils for inducing the vertical main magnetic field are disposed along the flux return path or at the poles. Typically, the pole pieces are positioned horizontally such that a vertical field is created therebetween. Many advantages are realized with the use of vertical field systems, such as openness for patient comfort and greater patient accessibility for the physician.

The RF coils used to manipulate magnetization as well as receive the magnetic resonance signals are different for vertical field open systems than for bore type systems. In a vertical field system, the $B_0$ orientation is directed across the patient as opposed to along the long axis of the patient, from head to toe. Useful RF magnetic fields, either linear or quadrature, are oriented perpendicular to $B_0$. Thus, vertical field systems have used solenoid coils along the patient axis, a coil which is not useful for a bore magnet, unless the coil is appropriately oriented relative to $B_0$. It is also desirable to have coils that conform to the openness requirements of the magnet. Volume coils for a bore type machine are often cylindrical, similar to the magnet bore. RF coils for a vertical field system are often parallel to the pole faces to maintain the desired openness of the magnet. Transmit RF coils for open systems usually consist of a pair of butterfly coils mounted parallel to the poles of the magnet. This conforms well to the open uses of the system.

Until recently, vertical field systems had a $B_0$ field of 0.2 to 0.35 Tesla with proton resonance frequencies of roughly 8 to 15 MHz. As field strength is increased, the resonance frequency increases proportionally, requiring different coil design techniques. Also, at low fields, the receive coil thermal noise dominates while at magnetic fields of 1 Tesla or more, patient thermal noise dominates. Consequently, in high field systems, smaller receive coils or arrays of smaller coils are used to limit the patient volume contributing to the noise. Quadrature coils are usually used at higher fields because the patient noise seen by the orthogonal coils is also orthogonal resulting in a combined receive coil signal-to-noise improvement.

The present invention contemplates a new and improved RF coil for use in a vertical field system at higher field strengths which overcomes the above-referenced problems and others.

SUMMARY OF THE INVENTION

In accordance with one aspect of the present invention, a magnetic resonance apparatus is provided. It includes an examination region through which a temporally constant $B_0$ main magnetic field is generated. An RF transmitter transmits radio frequency pulses to a quadrature RF coil assembly to excite resonance in selected dipoles in the examination region such that the dipoles generate resonance signals at a characteristic resonance frequency. The quadrature RF coil assembly receives resonance signals from the resonating dipoles. At least one RF receiver demodulates the resonance signals from the quadrature RF coil assembly. The quadrature RF coil assembly includes a first RF ladder coil and a second RF ladder coil which are disposed in a parallel relationship to the pole pieces. The first and second RF ladder coils are rotated by 90° relative to each other.

In accordance with a more limited aspect of the present invention, the RF coil assembly further includes a third RF ladder coil which is disposed partially overlapping the first RF ladder coil and is rotated by 90° relative to the first RF ladder coil. A fourth RF ladder coil is disposed partially overlapping the second RF ladder coil and is rotated by 90° relative to the second RF ladder coil.

In accordance with another aspect of the present invention, a crossed-ladder RF coil for an open magnetic resonance imaging system is provided. The crossed-ladder RF coil includes a first tuned ladder coil and a second tuned ladder coil which are disposed in a parallel relationship to each other and substantially orthogonal to the $B_0$ field. The first and second ladder coils are rotated by 90° relative to one another.

In accordance with another aspect of the present invention, a method of magnetic resonance imaging in which a temporally constant main magnetic field is generated through an examination region and gradient magnetic fields are generated for spatial selection and position encoding. The method includes positioning a first ladder RF coil normal to the main magnetic field on one side of the examination region. Further, a second ladder RF coil is positioned parallel to the first ladder RF coil where the first and second ladder coils are rotated by 90° relative to one another. Magnetic resonance is excited in dipoles of interest. Induced magnetic resonance signals are then received in quadrature with the first and second RF ladder coils. Finally, the received magnetic resonance signals are reconstructed into an image representation.

One advantage of the present invention is that it provides a planar RF transmitter which can be used at higher fields because it is a resonant structure.

Another advantage of the present invention is that a quadrature pair of ladder coils can be used on both sides of the examination region for better RF $B_1$ magnetic field uniformity.

Another advantage of the present invention is that it allows for quadrature excitation and/or reception within the examination volume.

Another advantage of the present invention is that a pair of ladder coils used as receive surface coils can be sized for optimum coverage and signal-to-noise ratio.

Another advantage of the present invention is that the ladder coils can be arranged in arrays for good coverage of the examination region.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
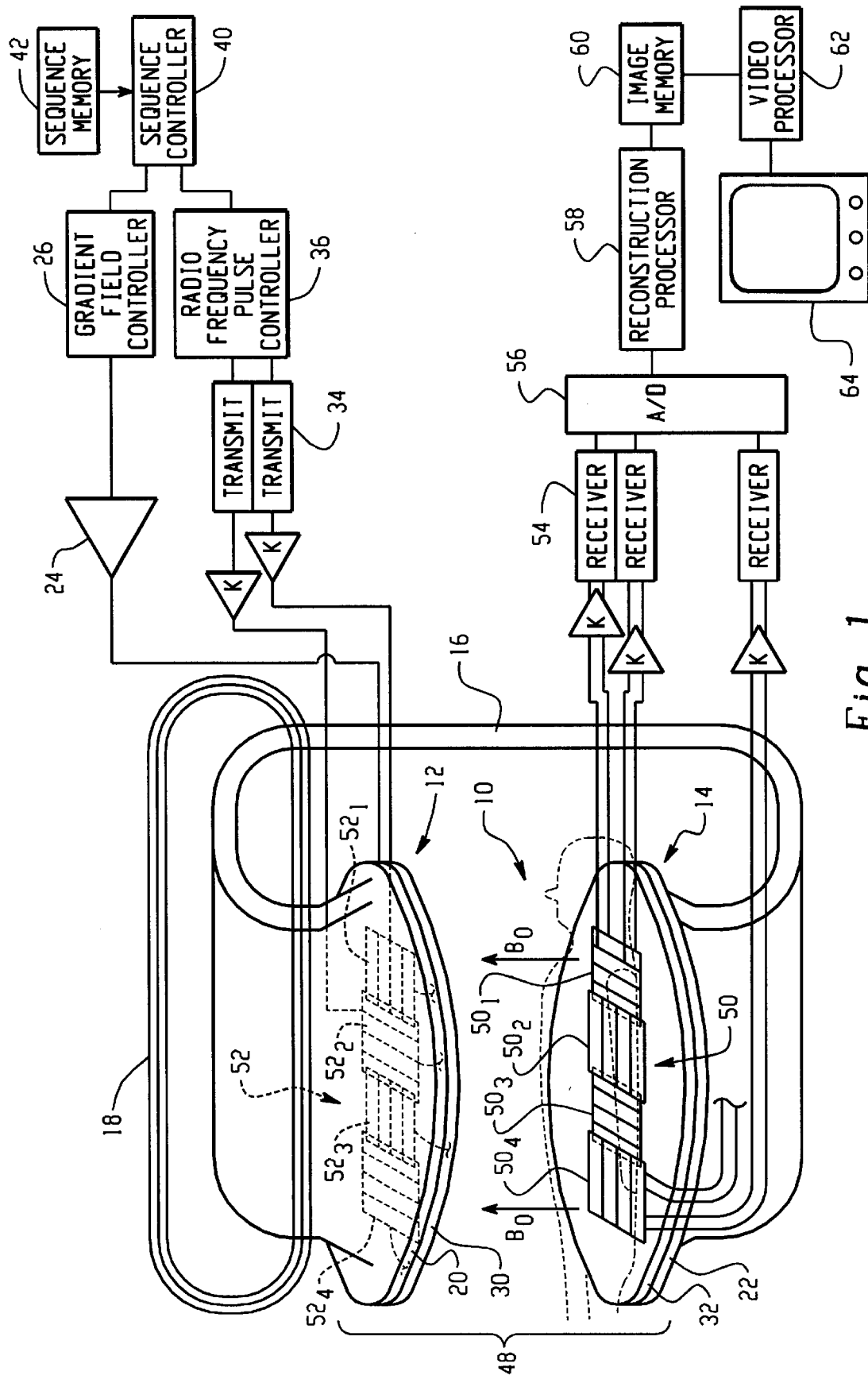
FIG. 1 is a diagrammatic illustration of a magnetic resonance imaging system in accordance with the present invention.

With reference to FIG. 1, in an open MRI system, an imaging or examination region 10 is defined between pole pieces 12, 14. In one embodiment, the pole pieces are interconnected by a ferrous flux return path 16, such as C or H-shaped iron elements, multiple ferrous posts, wall panels, or the like. In this embodiment, the iron element 16 is a permanent magnet which generates a vertical $B_0$ main magnetic field between the pole faces across the imaging region 10. Alternately, the pole pieces are independently supported on opposite sides of the examination region without connection by a ferrous flux return path. In a preferred embodiment, electrical, superconducting windings 18 induce the magnetic flux in the ferrous flux path 16 and the $B_0$ field across the pole faces. In another embodiment, annular superconducting magnets surround each pole piece, generating the $B_0$ field through the examination region 10. It is to be appreciated that the open MRI system may operate with or without pole pieces and with or without a ferrous flux return path.

For imaging, magnetic field gradient coils 20, 22 are disposed on opposite sides of the examination region 10, near the pole pieces 12, 14. In the preferred embodiment, the gradient coils are planar coil constructions which are connected by gradient amplifiers 24 to a gradient magnetic field controller 26. The gradient magnetic field controller 26 causes current pulses which are applied to the gradient coils such that gradient magnetic fields are superimposed on the temporally constant and uniform magnetic field throughout the examination region. The gradient fields are directed similar to the $B_0$ field but with gradients along a longitudinal or z-axis, a vertical or y-axis, and a transverse or x-axis.

In order to excite magnetic resonance in dipoles of a subject disposed in the examination region 10, radio frequency coils 30, 32 typically are disposed between the gradient coils 20, 22 and the imaging region 10. At least one radio frequency transmitter 34, preferably a digital transmitter, causes the radio frequency coils to transmit radio frequency pulses requested by a radio frequency pulse controller 36 to be transmitted into the imaging region 10. A sequence controller 40, under operator control, retrieves an imaging sequence from a sequence memory 42. The sequence controller 40 provides the sequence information to the gradient controller 26 and the radio frequency pulse controller 36 such that radio frequency and gradient magnetic field pulses in accordance with the selected sequence are generated.

Typically, the radio frequency coils 30, 32 are general purpose coils and are built-in to provide excitation of nuclei in the imaging region 10 and are suitable for receiving resonance signals. On the other hand, specialty surface coils are often employed for greater flexibility. Typically, such coils are removable and may be the only radio frequency coils in the system.

With continuing reference to FIG. 1, a radio frequency coil assembly 48 is positioned between the poles 12, 14, adjacent the imaging region 10. As is explained in greater detail below, the radio frequency coil assembly 48 includes a pair of crossed-ladder RF coil arrays 50, 52. The RF coil assembly 48 is capable of RF transmission and/or reception in quadrature. At least one RF transmitter 34, preferably a digital transmitter, causes the RF coil assembly 48 to transmit RF pulses into the examination region 10, exciting magnetic resonance in dipoles of interest. The RF coil assembly 48, like coil assemblies 30, 32 receive magnetic resonance signals which are demodulated by one or more receivers 54, preferably digital receivers. Signals from analog receivers are digitized with an analog-to-digital converter 56. The digitized signals are processed by a reconstruction processor 58 into volumetric or other image representations which are stored in a volumetric image memory 60. A video processor 62, under operator control, withdraws selected image data from the volume memory and formats it into appropriate format for display on a human-readable display 64, such as a video monitor, active-matrix monitor, liquid crystal display, or the like.

Figure 2A:
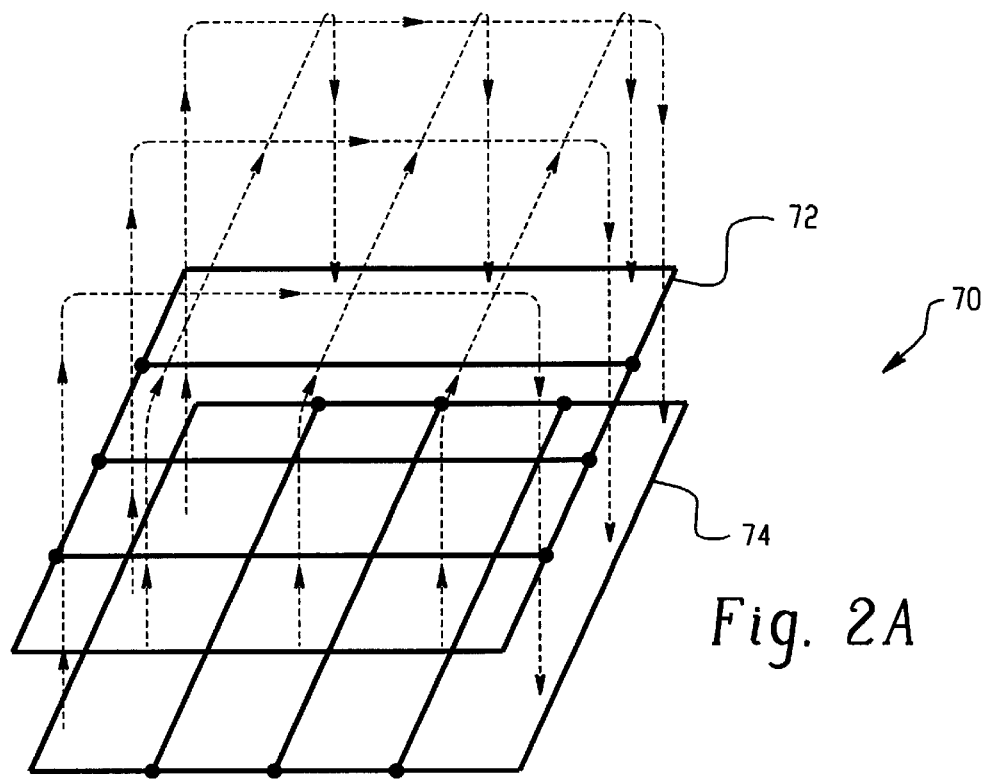
FIG. 2A is a diagrammatic illustration of a crossed-ladder RF coil assembly for placement on one side of the examination region in accordance with the present invention.

With reference to FIG. 2A and continuing reference to FIG. 1, a crossed-ladder RF coil 70 for quadrature excitation and/or reception is provided. The RF coil 70 includes two ladder coils 72, 74. Each single ladder coil 72, 74 may have an even or odd number of rungs. As shown in FIG. 2A, the first ladder coil 72 and second ladder coil 74 are disposed in a parallel relationship to one another in parallel planes perpendicular to the $B_0$ field. The planes of the ladder coils 72, 74 are parallel to the main magnet pole pieces 12, 14. The first and second ladder coils 72, 74 are oriented such that they are rotated by 90° relative to one another in a "crossed-ladder" configuration.

In one embodiment of the present invention, the first and second ladder coils 72, 74 are completely overlapping or aligned. Preferably, the first ladder coil 72 is constructed of copper strips which are mounted on one side of a flexible support sheet, such as plastic. The second ladder coil 74 is also constructed out of copper strips and mounted on the second side of the flexible support sheet. In this manner, the first ladder coil 72 and second ladder coil 74 are electrically insulated from one another. In this embodiment, the crossed-ladder RF coil 70 is located under the patient, optionally built into the patient support table, for imaging local regions of the neck and spine. It is to be appreciated that the crossed-ladder RF coil may be located above the patient as well. Although described as planar, it is to be appreciated that the planes can be curved to mimic surfaces of the patient.

Figure 2B:
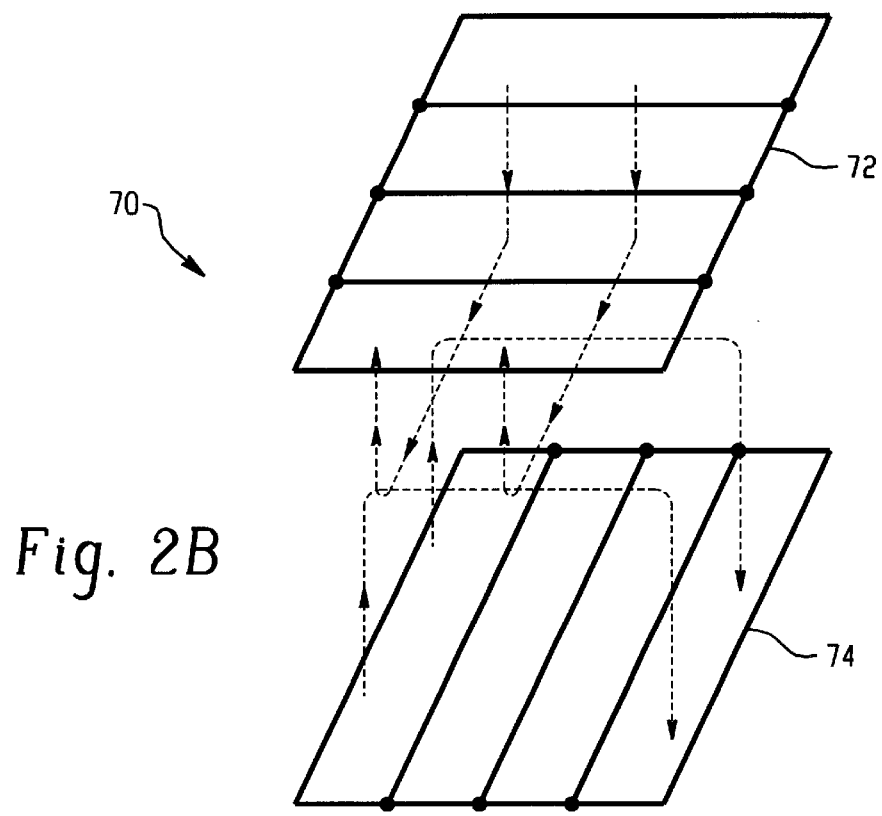
FIG. 2B is a diagrammatic illustration of a crossed-ladder RF coil assembly for placement on opposite sides of the examination region in accordance with the present invention.

Alternately, as illustrated in FIG. 2B, the first and second ladder coils 72, 74 are disposed in a parallel, spaced-apart relationship on opposite sides of the imaged volume. In this embodiment, the first ladder coil 72 is positioned between the top pole 12 and the imaging region 10, above the subject. Conversely, the second ladder coil 74 is positioned between the bottom pole 14 and the imaging region 10, below the subject. As in the aforementioned embodiment, the first and second ladder coils 72, 74 are rotated by 90° relative to one another. In this configuration, a quadrature or slab exists adjacent a mid-plane between the bottom and top poles 12, 14.

In both of the above embodiments, the coils 72, 74 are tuned to maximize the $B_1$ mode of each ladder coil by selecting the $B_1$ field mode that is parallel to the surface of the coil and normal to the legs. Coil tuning is selected to suppress other transverse resonance modes. The orthogonal modes normal to the surface of the coil are also discarded. Quadrature is achieved by the 90° relationship of the two ladder coils. This parallel $B_1$ mode is generated by an even, symmetric current distribution with respect to the center of each ladder coil. The parallel placement of the two ladder coils 72, 74 adjacent the pole pieces facilitates openness and access to the subject. It is to be appreciated that quadrature operation may be achieved with the crossed-ladder RF coils of the present invention for an open system where the primary $B_0$ magnetic field is horizontal and orthogonal to the surface of the ladder RF coils 72, 74.

Figure 3A:
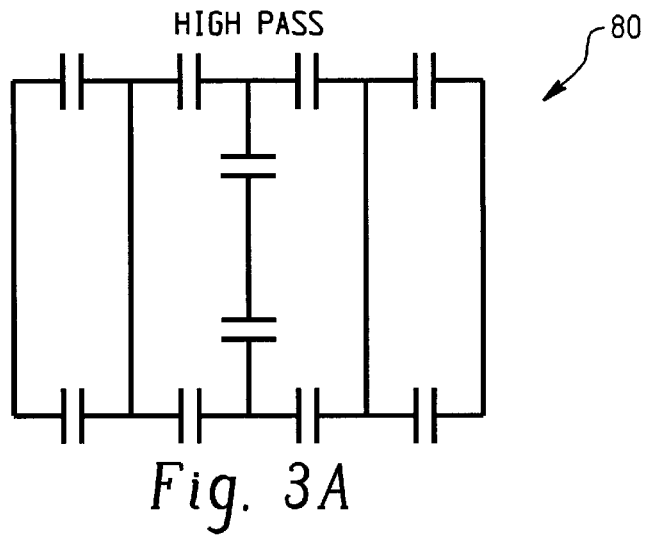
FIGS. 3A, 3B, and 3C are diagrammatic illustrations of exemplary highpass, lowpass, and bandpass ladder coils to be used in a crossed-ladder configuration in accordance with the present invention.
Figure 3B:
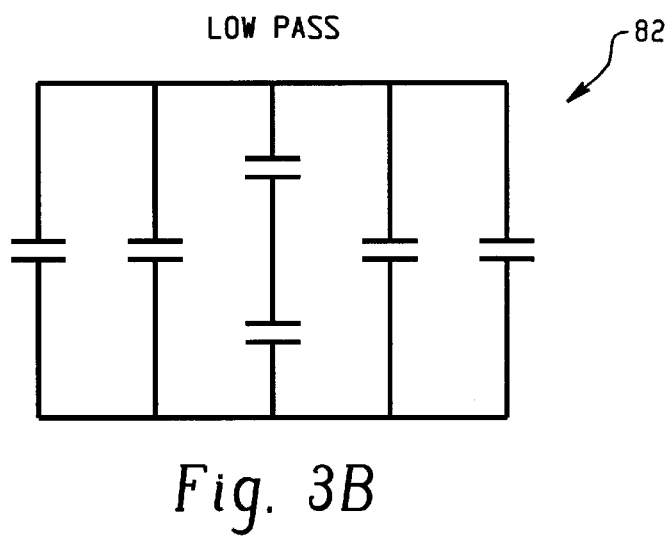
Figure 3C:
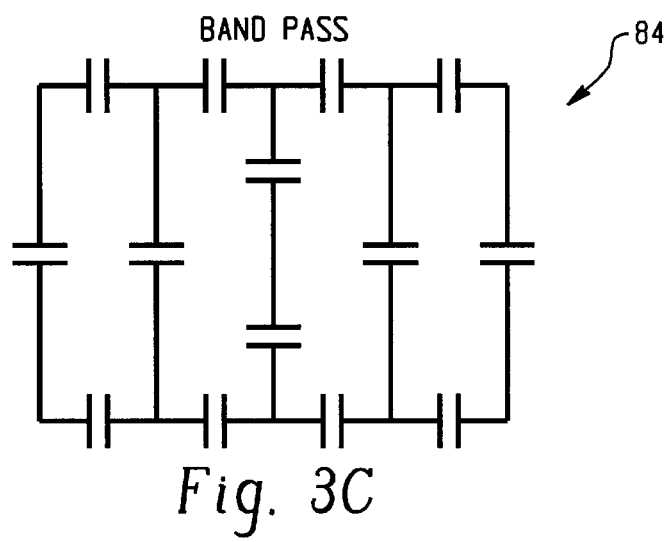

With reference to FIGS. 3A, 3B, and 3C and continuing reference to FIGS. 2A and 2B, the ladder coils employed in the present RF coil may be highpass 80, lowpass 82, or bandpass 84 depending on the resonant frequency and modes of interest. The ladder coils 80, 82, 84 may be tuned to produce the parallel $B_1$ mode at the desired frequency of interest by varying the numbers, positions, and values of capacitors around each coil, as shown in FIGS. 3A–3C. It is to be appreciated that the uniformity of the $B_1$ field will improve as more legs or rungs are added to each ladder coil.

Figure 4:
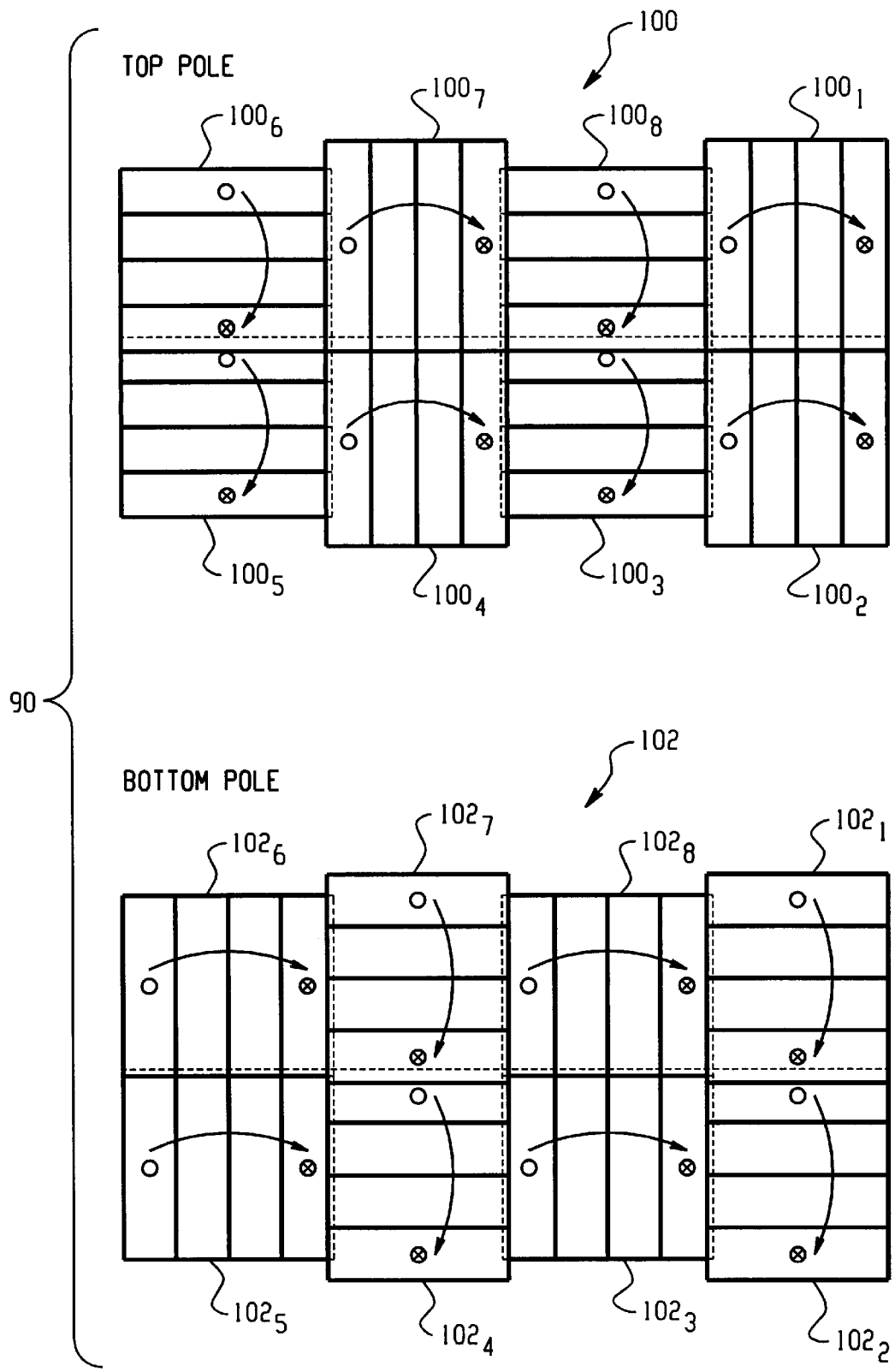
FIG. 4 is a diagrammatic illustration of a crossed-ladder coil array in accordance with the present invention.

With reference to FIG. 4 and continuing reference to FIGS. 3A–3C and FIG. 1, a quadrature RF coil assembly 90 for a vertical field system is provided. The RF coil assembly includes a pair of RF coil arrays 100, 102. Each coil array 100, 102 consists of a plurality of individual ladder coils, $100_1, \ldots, 100_8; 102_1, \ldots, 102_8$ (capacitors for highpass, lowpass, and bandpass configurations not shown). The ladder coils $100_1, \ldots, 100_8$, of the top coil array 100 are each rotated by 90° relative to the corresponding coils $102_1, \ldots, 102_8$ in the bottom coil array 102, as shown in FIG. 4. The 90° offset across the imaging region enables quadrature detection. The individual ladder coils of each coil array 100, 102 are also rotated 90° relative to longitudinally adjacent coils and overlapped to eliminate coupling between the individual ladder coils. The overlap between $100_1, \ldots, 100_2$, with adjacent coils $100_3, 100_8$ is selected to minimize the mutual inductance. Coils $100_1, 100_2$ are effectively a single elongated coil as are coils $100_3, 100_8$, etc.

In one embodiment, the first and second crossed-ladder coil arrays 100, 102 are disposed in a parallel, spaced-apart relationship. The first crossed-ladder coil array 100 is positioned between the top pole 12 and the imaging region 10, above the patient. Conversely, the second crossed-ladder coil array 102 is positioned between the bottom pole 14 and the imaging region 10, below the patient. Each ladder coil $102_1, \ldots, 102_8$ of the second crossed-ladder coil array 102 is rotated by 90° relative to each corresponding ladder coil $100_1, \ldots, 100_8$ of the first crossed-ladder coil array 100, as shown in FIG. 4. It is to be appreciated that each coil array may include greater or fewer ladder coils than illustrated in FIG. 4. In this embodiment, an elongated RF quadrature slab is defined along the mid-plane between the bottom and top poles 12, 14 for RF quadrature excitation and/or reception.

In one embodiment, each individual ladder coil $100_1, \ldots, 100_8; 102_1, \ldots, 102_8$ of the first and second crossed-ladder coil arrays 100, 102 is of a square geometry, rather than rectangular. This geometry is illustrated in FIGS. 3A–3C. Square ladder coils provide the same $B_1$ amplitude as adjacent square ladder coils when rotated by 90°. Preferably, for a given imaging area, each crossed-ladder coil array 100, 102 includes a plurality of individual ladder coils each of a smaller area rather than fewer ladder coils each of a larger area. An array comprising a plurality of smaller ladder coils provides better $B_1$ uniformity and better signal-to-noise ratio than fewer ladder coils of larger area.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance apparatus which generates a temporally constant main magnetic field $B_0$ between a pair of pole regions through an examination region, an RF transmitter which transmits radio frequency pulses to a quadrature radio frequency coil assembly to excite resonance in selected dipoles in the examination region such that the dipoles generate resonance signals at a characteristic resonance frequency, said quadrature radio frequency coil assembly receiving resonance signals from the resonating dipoles, at least one radio frequency receiver for demodulating the resonance signals received from the quadrature RF coil assembly, the quadrature RF coil assembly comprising:

first RF ladder coil disposed in a plane transverse to the $B_0$ field; and, a second RF ladder coil disposed in a parallel relationship to and adjacent the first RF ladder coil, the second RF ladder coil being rotated by 90° relative to the first RF ladder coil, the first and second ladder coils each including:

at least five parallel legs;

electrical conductive sides interconnecting ends of the legs; and at least one capacitive element interrupting at least one of the legs and sides.

2. The magnetic resonance apparatus according to claim 2, wherein the ladder coils are one of highpass, lowpass, and bandpass ladder coils.

3. The magnetic resonance apparatus according to claim 2, wherein each ladder coil contains one of highpass, lowpass, and bandpass capacitive elements for producing a $B_1$ mode which is parallel to each ladder coil.

4. A magnetic resonance apparatus having an examination region through which a temporally constant main magnetic field $B_0$ is generated, an RF transmitter which transmits radio frequency pulses to a quadrature radio frequency coil assembly to excite resonance in selected dipoles in the examination region such that the dipoles generate resonance signals at a characteristic resonance frequency, said quadrature radio frequency coil assembly receiving resonance signals from the resonating dipoles, at least one radio frequency receiver for demodulating the resonance signals received from the quadrature RF coil assembly, the quadrature RF coil assembly comprising:

a first RF ladder coil disposed in a plane orthogonal to the main magnetic field which receives a linear, non-quadrature $B_1$ field component along a first axis; and, a second RF ladder coil disposed adjacent and rotated by 90° relative to the first RF ladder coil, said second ladder coil receiving a linear, non-quadrature $B_1$ field component along a second axis orthogonal to the first axis, the first and second RF ladder coils being disposed in a spaced apart relationship with the first RF ladder coil positioned above the examination region and the second RF ladder coil positioned below the examination region whereby the first and second coils receive $B_1$ field components from a common volume that are orthogonal to each other.

5. The magnetic resonance apparatus according to claim 1, wherein the ladder coils are square.

6. The magnetic resonance apparatus according to claim 5, wherein the quadrature RF coil assembly further comprises:

a third RF ladder coil disposed in an overlapping relationship with the first RF ladder coil, the third RF ladder coil being rotated 90° relative to the first RF ladder coil; and a fourth RF ladder coil disposed in an overlapping relationship with the second RF ladder coil, the fourth RF ladder coil being rotated 90° relative to the second RF ladder coil.

7. A magnetic resonance apparatus having an examination region through which a temporally constant main magnetic field $B_0$ is generated, an RF transmitter which excites resonance in selected dipoles in the examination region such that the dipoles generate resonance signals at a characteristic resonance frequency, a radio frequency coil assembly which receives resonance signals from the resonating dipoles, at least one radio frequency receiver for demodulating the received resonance signals from the quadrature RF coil assembly, the quadrature RF coil assembly comprising:

a first RF ladder coil which receives a uni-directional $B_1$ field component parallel to a first axis;

a second RF ladder coil disposed partially overlapping and rotated 90° relative to the first ladder coil, said second ladder coil receiving a uni-directional $B_1$ field component parallel to a second axis orthogonal to the first axis; and a third RF ladder coil disposed partially overlapping and rotated 90° relative to the second ladder coil, said third ladder coil receiving a uni-directional $B_1$ field parallel to the first axis;

the first, second, and third RF ladder coils being disposed on the same side of the examination region.

8. A magnetic resonance apparatus having an examination region through which a temporally constant main magnetic field $B_0$ is generated, an RF transmitter which transmits radio frequency pulses to a quadrature radio frequency coil assembly to excite resonance in selected dipoles in the examination region such that the dipoles generate resonance signals at a characteristic resonance frequency, said quadrature radio frequency coil assembly receiving resonance signals from the resonating dipoles, at least one radio frequency receiver for demodulating the resonance signals received from the quadrature RF coil assembly, the quadrature RF coil assembly comprising:

a first RF ladder coil disposed in a parallel relationship to pole pieces;

a second RF ladder coil disposed in a parallel relationship to the pole pieces adjacent the first RF ladder coil, the second RF ladder coil being rotated by 90° relative to the first RF ladder coil;

a third RF ladder coil disposed partially overlapping the first RF ladder coil, the third RF ladder coil being rotated 90° relative to the first RF ladder coil; and, a fourth RF ladder coil disposed partially overlapping the second RF ladder coil, the fourth RF ladder coil being rotated 90° relative to the second RF ladder coil.

9. The magnetic resonance apparatus according to claim 8 further including:

a fifth RF ladder coil disposed partially overlapping the third RF ladder coil, the fifth RF ladder coil being rotated 90° relative to the third RF ladder coil;

a sixth RF ladder coil disposed partially overlapping the fourth RF ladder coil, the sixth RF ladder coil being rotated 90° relative to the fourth Rf ladder coil.

10. The magnetic resonance apparatus according to claim 9 wherein the overlap between each pair of overlapping RF ladder coils is selected to minimize mutual inductance.

11. A crossed-ladder RF coil assembly for an open magnetic resonance imaging system in which a $B_0$ main magnetic field is generated through an examination region, said crossed-ladder RF coil comprising:

a first linear tuned ladder coil which generates and receives linear $B_1$ field components which are parallel to a first axis; and a second linear tuned ladder coil which generates and receives linear $B_1$ field components which are parallel to a second axis orthogonal to the first axis, the first and second ladder coils being disposed in a parallel, overlapping relationship with (i) the first ladder coil mounted on a first side of a support sheet and the second ladder coil mounted on a second side of the support sheet, (ii) the second ladder coil rotated by 90° relative to the first ladder coil, and (iii) both the first and second ladder coils oriented transverse to the $B_0$ field.

12. The crossed-ladder RF coil according to claim 11, wherein the first and second ladder coils each include:

a plurality of parallel legs;

electrical conductive sides interconnecting ends of the legs; and at least one capacitive element interrupting at least one of the legs and sides.

13. A crossed-ladder RF coil for an open magnetic resonance imaging system in which a $B_0$ main magnetic field is generated through an examination region, said crossed-ladder RF coil comprising:

a first tuned ladder coil and a second tuned ladder coil, said first and second ladder coils being rotated by 90° relative to one another and disposed in a parallel, spaced-apart relationship such that the first ladder coil is positioned on one side of the examination region and the second ladder coil is positioned on an opposite side of the examination region.

14. A crossed-ladder RF coil for an open magnetic resonance imaging system in which a $B_0$ main magnetic field is generated through an examination region, said crossed-ladder RF coil comprising:

a first tuned ladder coil and a second tuned ladder coil disposed in a parallel relationship to each other and substantially orthogonal to the $B_0$ field, the first and second ladder coils being rotated by 90° relative to one another;

a third RF ladder coil disposed partially overlapping the first RF ladder coil, the third RF ladder coil being rotated 90° relative to the first RF ladder coil; and, a fourth RF ladder coil disposed partially overlapping the second RF ladder coil, the fourth RF ladder coil being rotated 90° relative to the second RF ladder coil.

15. A method of magnetic resonance imaging in which a temporally constant main magnetic field is generated through an examination region, the method including:

(a) tuning a first ladder RF coil to a first $B_1$ mode component which is parallel to the first ladder RF coil, (b) positioning the first ladder RF coil in a plane transverse to the main magnetic field on one side of the examination region;

(c) tuning a second ladder RF coil to a second B1 mode component that is parallel to the second ladder RF coil;

(d) positioning the second ladder RF coil in a plane parallel to the first ladder RF coil, said first and second ladder coils being rotated by 90° relative to one another such that the first and second $B_1$ mode components are orthogonal to one another;

(e) exciting magnetic resonance in dipoles of interest in the examination region;

(f) receiving induced magnetic resonance signals in quadrature by receiving the first $B_1$ mode component with the first RF ladder coil and the orthogonal second $B_1$ mode component with the second ladder coil; and (g) reconstructing the received magnetic resonance signals into an image representation.

16. A method of magnetic resonance imaging in which a temporally constant main magnetic field is generated through an examination region, the method including:

(a) tuning a first ladder RF coil to a first $B_1$ mode component which is parallel to the first ladder RF coil, (b) positioning the first ladder RF coil in a plane transverse to the main magnetic field on one side of the examination region;

(c) tuning a second ladder RF coil to a second $B_1$ mode component that is parallel to the second ladder RF coil;

(d) positioning the second ladder RF coil in a partially overlapping relationship to the first ladder RF coil such that the mutual inductance between the coils is minimized, said first and second ladder coils being rotated by 90° relative to one another such that the first and second $B_1$ mode components are orthogonal to one another; and, (e) reconstructing the received magnetic resonance signals into an image representation.

17. A method of magnetic resonance imaging in which a temporally constant main magnetic field is generated through an examination region, the method including:

(a) tuning a first ladder RF coil to a first $B_1$ mode component which is parallel to the first ladder RF coil, (b) positioning the first ladder RF coil in a plane transverse to the main magnetic field on one side of the examination region;

(c) tuning a second ladder RF coil to a second $B_1$ mode component that is parallel to the second ladder RF coil;

(d) positioning the second ladder RF coil on an opposite side of the examination region spaced apart from the first ladder RF coil, said first and second ladder coils being rotated by 90° relative to one another such that the first and second $B_1$ mode components are orthogonal to one another;

(e) receiving induced magnetic resonance signals in quadrature by receiving the first $B_1$ mode component with the first RF ladder coil and the orthogonal second $B_1$ mode component with the second ladder coil; and (f) reconstructing the received magnetic resonance signals into an image representation.

* * * * *